(12) United States Patent
Betz

(10) Patent No.: US 6,902,617 B2
(45) Date of Patent: Jun. 7, 2005

(54) METHOD OF WELDING SINGLE CRYSTALS

(75) Inventor: Jürgen Betz, Bad Munster-Ebernburg (DE)

(73) Assignee: Sulzer Markets and Technology AG, Winterthur (CH)

( * ) Notice: Subject to any disclaimer, the term of this patent is extended or adjusted under 35 U.S.C. 154(b) by 54 days.

(21) Appl. No.: 10/397,050

(22) Filed: Mar. 24, 2003

(65) Prior Publication Data

US 2003/0213427 A1 Nov. 20, 2003

(Under 37 CFR 1.47)

(30) Foreign Application Priority Data

Mar. 26, 2002 (EP) .............................. 02405238

(51) Int. Cl.[7] .......................... C30B 25/12; C30B 25/14
(52) U.S. Cl. .............................. 117/9; 117/4; 117/903; 117/904; 117/905
(58) Field of Search ................... 117/4, 9, 903, 117/904, 905

(56) References Cited

U.S. PATENT DOCUMENTS

| | | |
|---|---|---|
| 5,106,010 A | 4/1992 | Stueber et al. |
| 5,374,319 A | 12/1994 | Stueber et al. |
| 5,554,837 A | 9/1996 | Goodwater et al. |
| 6,024,792 A | 2/2000 | Kurz et al. |
| 6,054,672 A | 4/2000 | Foster et al. |
| 6,333,484 B1 | 12/2001 | Foster et al. |

FOREIGN PATENT DOCUMENTS

| | | |
|---|---|---|
| EP | 0478374 B1 | 5/1997 |
| EP | 0892090 A1 | 1/1999 |
| EP | 0711621 B1 | 3/1999 |
| EP | 0785837 B1 | 10/2001 |
| JP | 62183986 | 8/1987 |
| JP | 63140787 | 6/1988 |

*Primary Examiner*—Felisa Hiteshew
(74) *Attorney, Agent, or Firm*—Townsend and Townsend and Crew LLP

(57) ABSTRACT

A method of single crystal welding is provided for the production of a single crystal region (1) on a surface (2) of a moncrystalline substrate (3) by means of an energy beam (4). The method of single crystal welding includes the supply of a coating material (5), the formation of a melt (6) by melting the coating material (5) by means of the energy beam (4) and the melting of a surface layer (71, 72) of the single crystal substrate (3) by the energy beam (4). The characteristic (8) of the energy distribution in the energy beam (4) is set, in this connection, such that the lateral thermal flow ($H_1$) from the melt into the single crystal substrate (3) is minimized.

17 Claims, 4 Drawing Sheets

000# METHOD OF WELDING SINGLE CRYSTALS

BACKGROUND OF THE INVENTION

The invention relates to a method of welding single crystals on a monocrystalline substrate and to the use of the method for supplementing a single crystal surface structure of a worn single crystal substrate.

It is known to manufacture metallic workpieces subject to high mechanical, chemical or thermal stresses not by classical casting processes, but to grow them in the form of single crystals from the metallic melt. In this connection, well-known methods (which can be suitably modified) such as the Bridgman process are used. This means that the workpiece is obtained in the desired form in a controlled manner by directional solidification from a metal melt.

When single crystals or single crystal areas, layers or structures are spoken of in the present specification, these include single crystals which have no grain boundaries or, at the most, small-angle grain boundaries of less than 10°. The previously named terms can thus also be understood to include so-called "directionally solidified structures", with these being single crystal structures which have grain boundaries which are, however, substantially parallel, i.e. only extend in one direction.

Such metallic workpieces having a single crystal structure are preferably used as machine components which are exposed to high temperatures and severe mechanical or chemical stresses over longer periods of time. For instance, as a rule the melting temperature of the single crystal structures can, for example, be substantially increased with respect to the melting temperature of a corresponding polycrystalline workpiece manufactured of the same material. The melting point is moreover defined much more sharply in the single crystal workpieces.

For this reason, single crystal machine parts are e.g. particularly suitable for use as blades of gas turbines or as rotors for aircraft power plants. So-called "super-alloys", e.g. on a nickel (Ni) or on a cobalt (Co) or on an iron (Fe) base, have proved themselves as alloys for such single crystal turbine blades. Particularly super-alloys on a nickel base such as CMSX-2 or CMSX-4 show exceptional mechanical, chemical and thermal properties even at high temperatures only a little below their melting point.

In spite of the previously described high durability of such moncrystalline machine parts, a certain wear of the surface occurs in operation over time due to the high stresses. That is, in operation, grooves, stepped shoulders, depressions or damage of a different kind, for example, can occur at the surface of such machine parts. It can even occur that, e.g. due to friction or other wear processes, e.g. of a chemical or thermal kind, whole surface regions are removed over a large area so that the corresponding machine parts either have to be replaced or their damaged surfaces have to be restored. Since the manufacture of complete workpieces in complex single crystal growth processes is very cost-intensive, it is usually preferable to restore damaged surfaces by suitable repair methods.

In this connection, the restoration (reconditioning), that is, the repair of the surfaces, has to take place by the rebuilding of single crystal layers or by supplementing single crystal areas. That is, the original structure is built up again on the substrate, e.g. on a single crystal turbine blade, layer for layer in a single crystal manner in the damaged areas (preferably using the same material of which the substrate is made). In this connection, the crystalline structure of the substrate must be continued without grain boundaries where possible. Such methods are described by the term "single crystal welding" within the context of this application.

A method of single crystal welding is known from EP 0 861 927 A1 with which it is possible to build up one or more layers, or a body or a workpiece with a single crystal structure, on the single crystal structure of a substrate. This method is an epitaxial method; i.e. the crystalline structure of the substrate is adopted by the layer which is being built up on it. Generally, epitaxy, or epitaxial growth, is understood as crystal growth in one direction, in particular on a single crystal base, i.e. on a substrate. Laser beams can for example also be used as energy sources or heat sources for the carrying out of these methods. It is possible with these to introduce high amounts of energy in a concentrated manner on a very small area. In the method shown in EP 0 861 927 A1, a beam of high energy and of high energy density is directed in a concentrated manner onto the surface of the substrate so that the surface layer of the substrate starts to melt a little. The required material for the reconstruction of the surface is supplied to the working area of the concentrated beam in the form of a wire or in the form of powder and is likewise melted by the beam of energy. With the known method of single crystal welding, a situation can be achieved by a suitable selection of the process parameters in which the melted material solidifies directionally, starting from a surface of the substrate, and grows on the surface of the substrate as an epitaxial layer.

This known method, which has successfully proven itself in principle in practice to date, is, however, still capable of improvement in one point. In the known method, the process of single crystal growth namely takes place such that the melted material directionally solidifies from all adjoining areas (i.e. adjoining the melted region). This means that different epitaxial growth areas can arise which can be oriented at a certain angle with respect to one another in accordance with the adjoining areas of the surface of the substrate. Within the framework of this application, such a growth is termed a "multi-axial growth". The term "uni-axial growth" is used in an analogous manner. These differently oriented growth regions can then meet at one or more interfaces, with grain boundaries then being able to form at said interfaces. Such grain boundaries between growth areas having different orientations with respect to one another therefore particularly occur when the surface is restored at stepped shoulders, at grooves or at depressions of the single crystal substrate. Problems of the kind described above can also occur on the application of large area layers to the single crystal substrate. In practice, the energy beam is guided over the substrate at a pre-settable speed so that narrow regions are produced in the form of tracks approximately of the width of the laser beam. In order to apply large area layers, a plurality of parallel tracks, directly adjoining one another, must thus be produced on the surface of the substrate by means of the laser beam, such that one is confronted with a step-like structure which favors epitaxial growth in different directions at the same time on the application of each further track (along a previously laid track).

SUMMARY OF THE INVENTION

It is therefore an object of the invention to propose an improved method of single crystal welding on single crystal surfaces with which the production of grain boundaries is prevented, with the exception of small-angle grain boundaries, in the newly produced single crystal regions.

A method is thus proposed in accordance with the invention of single crystal welding for the production of a single crystal region on a surface of a single crystal substrate by means of an energy beam. The method of single crystal welding includes the supply of a coating material, the formation of a melt by melting the coating material by means of the energy beam and the melting of a surface layer of the single crystal substrate by the energy beam. The characteristic of the energy distribution in the energy beam is set in this connection such that the lateral heat flow from the melt into the single crystal substrate is minimized.

The method in accordance with the invention is preferably used for single crystal welding for the restoration of the surface of a single crystal substrate whose surface has been damaged or worn in the form of stepped shoulders, grooves, depressions or in another manner. In this connection, layer on layer is built on and/or further built on the substrate in a single crystal manner until the original size and shape of the workpiece has again been reached, with the occurrence of grain boundaries being prevented, with the exception of small-angle grain boundaries, in the restored regions by the use of the method of single crystal welding in accordance with the invention.

In the method in accordance with the invention, an energy beam, e.g. a laser beam or an electron beam, is directed onto the surface of the substrate and guided over the surface in a pre-settable direction such that a surface layer of the substrate starts to melt. In the following, the region in which the energy beam directly unfolds its effect will be termed the working region. Coating material, e.g. in the form of powder or in the form of a wire or in another form, is supplied to the working region by a supply device such that the coating material is likewise melted. The supply device preferably allows the coating material to be supplied to the working region in pre-settable amounts, that is, in a metered manner. The melting of the supplied coating material can take place either in the liquid pool of the melted surface layer of the substrate or already on the way to the working region or simultaneously with the melting of the surface. In a preferred embodiment of the method in accordance with the invention, the characteristic of the energy distribution in the energy beam is set such that, for example, a pronounced energy maximum is present at the center of the energy beam which is preferably directed to the region of the working region to be melted, so that the substrate and the coating material can be melted in this region. The energy distribution in the energy beam then initially falls outside the energy maximum to a value which is no longer suitable to melt the substrate and the coating material, but which can still heat the material adjacent to the melt to just below the melting temperature. It is thereby achieved that a lateral temperature gradient between the melt and the adjacent solid material is minimized such that crystal growth in the lateral direction is suppressed. The crystal growth thus only takes place in one direction, as a rule in a direction perpendicular to the lateral direction and to the direction of guidance of the energy beam. The occurrence of grain boundaries is thus prevented. It must still be mentioned that the characteristic of the energy distribution which can be set in the energy beam can also have a different symmetry to that described above, depending on the demand. For example, the energy maximum can also lie at the border of the energy beam, or inside the energy beam; e.g. by overlapping of two or more individual rays which can originate from one or more different energy sources, it can have a lobe-like characteristic or any other suitable characteristic. In addition to the overlapping of a plurality of individual rays, the characteristic of the energy distribution in the energy beam can also be set by suitable devices, e.g. optical, magnetic or other lens systems or in another manner by a change in an individual energy beam.

Within the context of this application, the lateral direction is always that direction which stands perpendicular to the direction of the movement of the energy beam and simultaneously lies in that plane in which the energy beam is moved.

In addition to the use of the previously mentioned energy beams, arc processes such as micro-TIG or various plasma processes are possible as the method for the supply of energy or heat, with which it is possible to set a pre-settable energy distribution in the energy beam. Depending on the demands or on the kind of energy source used (laser beams, electron beams, arc processes or other), the coating process is carried out under inert gas or in vacuum in a suitable process chamber, with it also being conceivable to carry out the method under environmental atmosphere, that is, without the use of a special process chamber.

In the method in accordance with the invention, the single crystal structure is built up in the form of thin strips, layers, plates or even in more complex forms, with a plurality of the thin strips, layers, plates or even of the more complex forms being applied adjoining the substrate successively in parallel, directly next to one another or on top of one another, whereby the original shape of the substrate can be reconstructed.

In practice, the energy beam is as a rule guided over the surface of the substrate by means of a programmable regulation and/or control unit. In this connection, the power of the energy source can additionally be continuously adapted to the ongoing coating demands and the characteristic of the energy distribution within the energy beam can also be corrected and changed in an electronically programmable manner during the single crystal welding.

It is not necessary to go into the problems and the inherent laws of epitaxial crystal growth, the occurrence of dendrites, and questions associated therewith (e.g. G/V diagram), at this point, since they have long been known to one skilled in the art. Reference is made in this respect to EP 0 861 927 A1 and the literature cited there.

To avoid or reduce internal stresses in the substrate and/or in the applied single crystal layers or between the substrate and the applied single crystal layers, the substrate can be brought in special cases to a pre-heat temperature, preferably inductively or in another manner, which can preferably lie between 750° C. and 1100° C. depending on the material of which the substrate or the coating material is made. The epitaxial growth of the single crystal structures to be built up on the surface can thereby be additionally promoted in that, for example, recrystallization and/or creep in the crystalline structure is prevented or at least minimized. Under certain circumstances, however, it can be more advantageous—to be able to produce higher temperature gradients—to work with much lower pre-heat temperatures, i.e. at pre-heat temperatures below 750° C. and even completely without any pre-heating of the substrate.

Although the method in accordance with the invention prevents the occurrence of grain boundaries, the occurrence of small-angle grain boundaries can nevertheless not be fully excluded. It can thus be of advantage to reduce internal inherent stresses and to eliminate small-angle grain boundaries by stress relieving annealing of the substrate and the newly built up single crystal layer in the temperature range from 700° C. to 1250° C., preferably at approximately 1100° C., e.g. for the period of half an hour, an hour, two hours or longer, and by a subsequent slow cooling. High frequency devices, or other, for example conventional, heat sources can for example be used as the heat source for the stress-relieving annealing. In this connection, the specific treatment parameters such as heating-up rate, temperature, duration of the stress-relieving annealing, cooling down rate after the stress-relieving annealing, etc. depend, among other things, on the materials of which the substrate or the coating material is built up. Stress-relieving annealing for approximately one hour at a temperature of approximately 1150° C. with a subsequent slow cooling down has proved advantageous, for example, for CMSX-4.

The invention will be explained in more detail in the following with reference to the drawing. To distinguish the prior art from the method of single crystal welding in accordance with the invention, the reference numerals referring to features of the prior art are provided with a dash.

DESCRIPTION OF THE PREFERRED EMBODIMENTS

Figure 1:
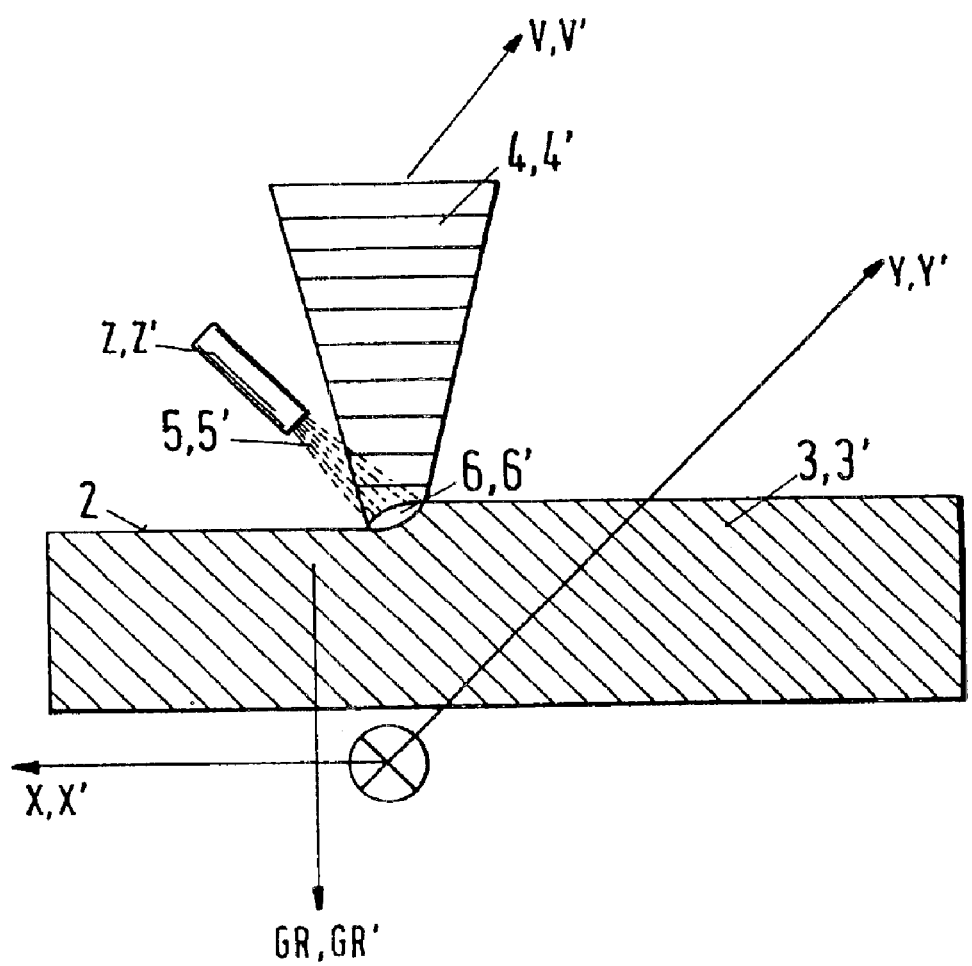
FIG. 1 shows an embodiment for the arrangement of the energy beam, the supply device and the substrate to be coated when using the method in accordance with the invention and the known method.

FIG. 1 schematically shows an example for the arrangement of the energy beam 4, 4', of the supply device Z, Z' and of the substrate 3, 3' to be coated when using the method in accordance with the invention and the known method. As already mentioned, those reference numerals which are provided with a dash always refer to features already known from the prior art in the following. FIG. 1 shows a single crystal substrate 3, 3' which has a surface damaged in the form of a step. The energy beam 4, 4', i.e. a laser beam, is directed onto the region in the vicinity of the step. Coating material 5, 5' is supplied to the working region of the energy beam by the supply device Z, Z'. The energy beam 4, 4' thus forms a melt 6, 6' on the surface, with the energy beam 4, 4' being able to be moved over the substrate 3, 3' in the direction Y, Y' along the step at an adjustable speed V, V'. The substrate 3, 3' can be pre-heated to a specific pre-heat temperature, with a temperature gradient GR, GR' being able to be additionally applied to the movement of the energy beam perpendicular to the lateral direction X, X' and perpendicular to the direction Y, Y' in order to generate a single crystal growth from the melt 6, 6' in the opposite direction to the temperature gradient GR, GR'.

Figure 2:
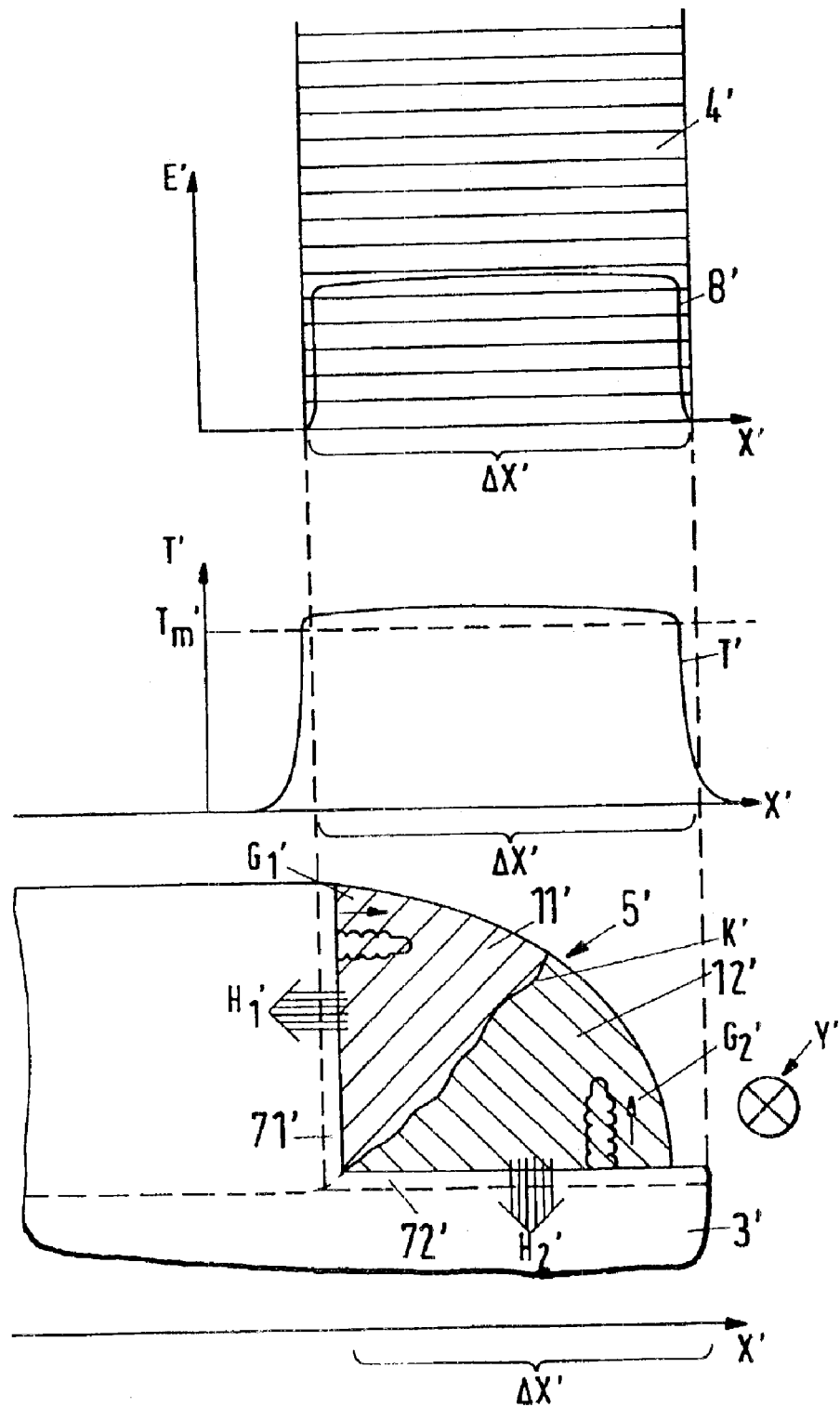
FIG. 2 illustrates multi-axially generated crystal growth at a surface of a single crystal substrate in accordance with a method of the prior art.

FIG. 2 demonstrates in a schematic representation a multi-axially generated crystal growth forming a single crystal region 11' and 12' at a step-like structure on a single crystal substrate 3' such as is typically generated with single crystal welding in accordance with the method known from the prior art.

A laser beam 4', which has a substantially constant characteristic 8' of an energy distribution over a cross-section $\Delta X'$, is directed onto a surface region on the substrate 3' which substantially has the same dimension $\Delta X'$ as the laser beam 4'. The coating material 5', and the surface layers 71' and 72' of the substrate 3', are melted on the surface of the substrate 3' in the region $\Delta X'$.

For the coating, the laser beam 4' is moved in accordance with FIG. 1 in direction Y' over the surface of the substrate 3' at a pre-settable speed V' under constant supply of new coating material 5'. Due to the substantially rectangular characteristic 8' of the energy distribution in the laser beam 4', a temperature gradient T results in the lateral direction X' which shows a largely constant temperature value above the melting temperature $T_m'$ in the melt 6' of the coating material 5' and which falls to a temperature value below the melting temperature $T_m'$ in a surface layer 71' of the substrate such that a large temperature gradient arises in the lateral direction X' which is so large that a corresponding lateral heat flow $H_1'$ arises per time unit. The lateral heat flow $H_1'$ removes so much thermal energy from the melt 6' that crystal growth is generated in the region 11' at a crystal growth rate $G_1'$ in the lateral direction X' from the border of the melt 6'. The analogue process takes place at the surface layer 72' not parallel to the surface 71', with a further heat removal $H_2'$ taking place via said surface layer 72' such that crystal growth is also generated in the region 12' perpendicular to the surface layer 72' at another crystal growth rate $G_2'$. Due to the different directions of crystal growth, the two growth regions 11' and 12' then form one or more common grain boundaries K' which ultimately result in a worsening of the mechanical, thermal or further properties of the surface layer in the operation of the repaired workpiece.

Figure 3:
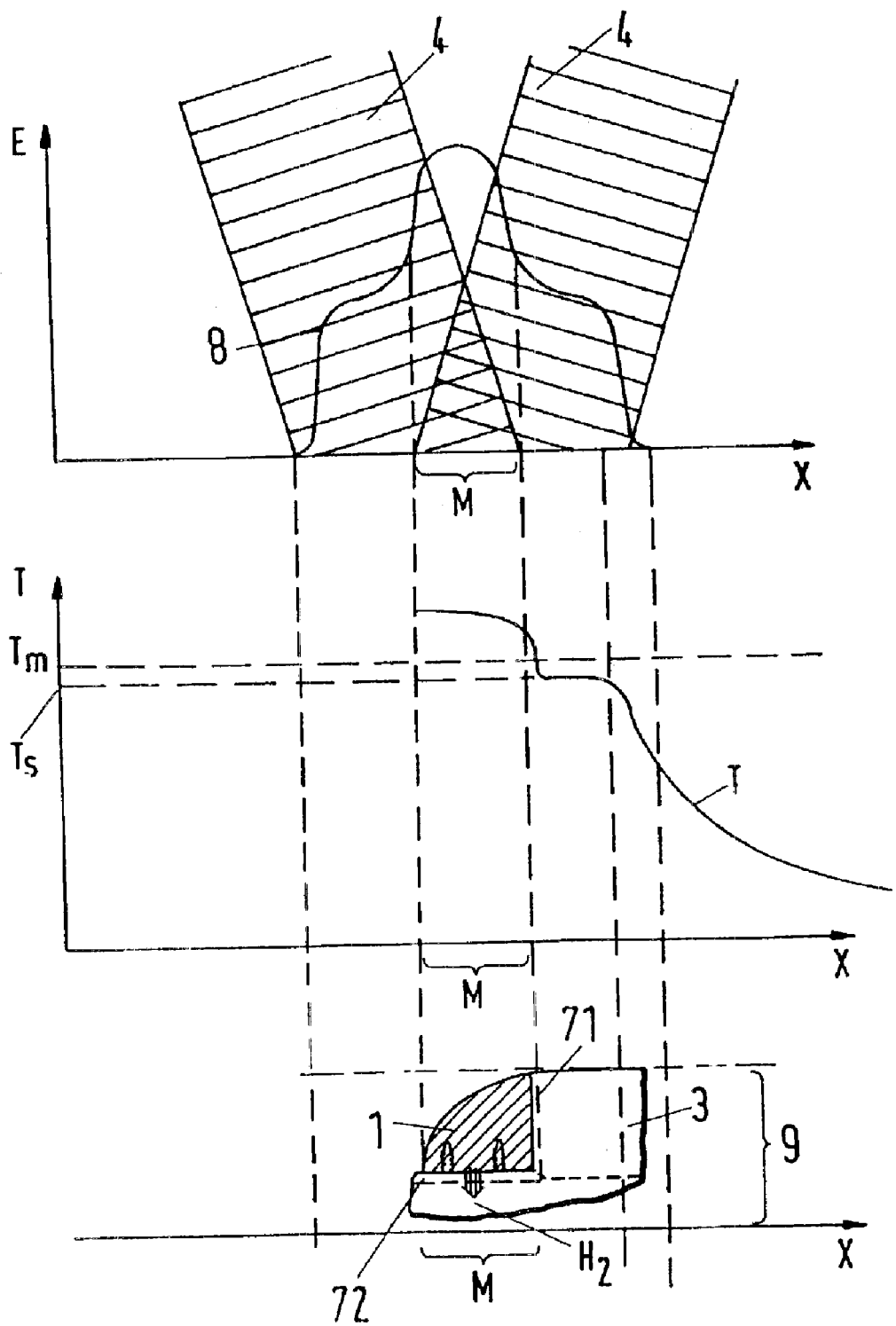
FIG. 3 shows an example for uni-axial crystal growth generated in accordance with the method of the invention at a surface of a single crystal substrate.
Figure 4:
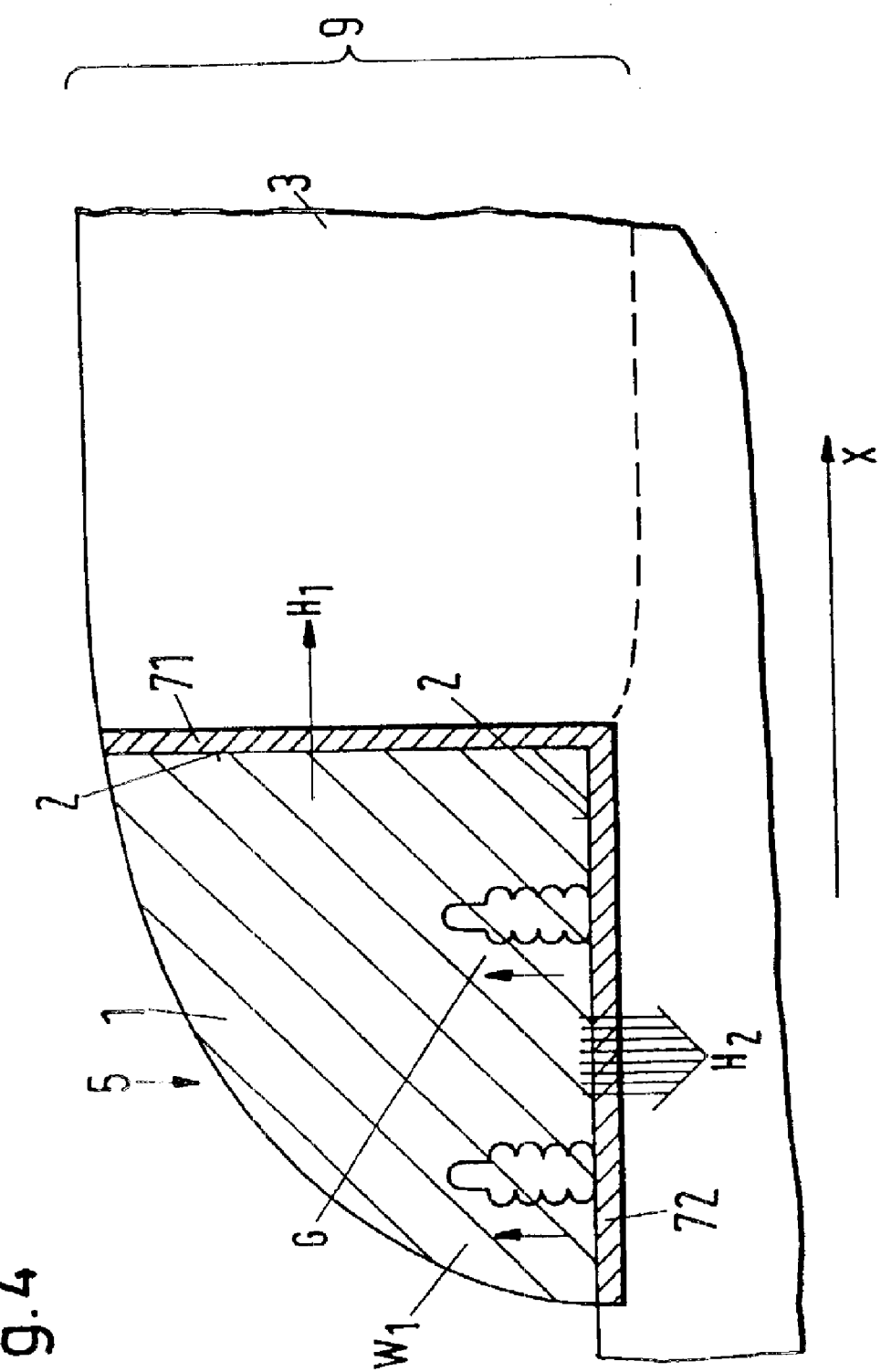
FIG. 4 shows an example for the growth kinetics in accordance with FIG. 2.

In FIGS. 3 and 4, the method of single crystal welding in accordance with the invention is shown in a schematic representation. The substrate and/or the coating material preferably includes so-called super alloys such as, e.g., IN 738LC, IN 939, IN 100, B 1914, CM 99, SRR 99, CM-247 LC, CMSX-2, CMSX-3, CMSX-4, CMSX-6, Mar-M002 or other super alloys or other suitable materials. In the preferred embodiment shown here, two energy beams, e.g. two laser beams, are brought partly overlapping in a melting region M close to the surface 2 of the substrate 3 to be melted. This has the consequence that the characteristic 8 of the energy distribution in the energy beam has a pronounced maximum in the melting region M. The characteristic 8 of the energy distribution then initially falls to a value outside the melting region M which corresponds to the energy content of an individual energy beam before ultimately falling to the energy value of zero in a region outside the energy beam. A corresponding lateral temperature profile T results in the melt 6 or in the surface of the substrate 3. In the region M, in which the coating material 5 is located, and in the surface layers 71 of the 72 of the substrate 3 adjoining the region M, a temperature prevails under the influence of the energy beam 4 which is higher than the melting temperature $T_m$ of the substrate 3 and of the coating material 5. In this connection, the energy beam is aligned and set such that only a thin boundary layer 71 and 72 of the substrate 3 is melted. In the lateral direction X, the temperature inside the substrate then first falls to a constant value $T_s$ below the melting temperature so that, in the lateral direction adjoining the melt 6 and inside the substrate 3, a region of substantially constant temperature $T_s$ is present, with the temperature $T_s$ lying so closely below the melting temperature $T_m$ that a heat flow $H_1$ is minimized in the lateral direction between the melt 6 and the substrate 3 directly adjoining it to the extent that crystal growth is practically suppressed in the lateral direction. In contrast, a correspondingly high temperature gradient is set between the melt 6 (at the surface layer 72 not parallel to the surface 71) and the adjoining substrate 3, e.g. by cooling the substrate, such that a heat outflow $H_2$ into the substrate arises. Ultimately, a crystal growth is thereby generated perpendicularly to the surface layer 72 with a crystal growth rate G.

By the use of the method of single crystal welding in accordance with the invention, the creation of a plurality of crystal growth areas 11' and 11' of different orientations, which necessarily occur in the method known from the prior art, is suppressed and thus the formation of grain boundaries K' is prevented, with the exception of small-angle grain boundaries. The quality of workpieces whose surfaces are reconditioned by the method in accordance with the invention is thereby substantially improved in comparison with workpieces treated in accordance with methods known from the prior art. The use of the method in accordance with the invention represents a significant advance in particular for the repair of machine parts which are used in areas in which the operational reliability of components with high thermal and mechanical stress is of decisive importance, such as in airplane construction.

What is claimed is:

1. A method of single crystal welding for the production of a single crystal region on a surface of a monocrystalline substrate means of at least two energy beams, including:

the supply of a coating material;

the formation of a melt by melting the coating material by means of the at least two energy beams;

the melting of a surface layer of the single crystal substrate by the at least two energy beams; and setting the energy distribution in the at least two energy beams such that a lateral thermal flow from the melt into the single crystal substrate is minimized.

2. A method in accordance with claim 1, wherein a growth of the single crystal region on the substrate is substantially only generated in a pre-settable direction.

3. A method in accordance with claim 1, in which at least one laser beam is used as the energy beam.

4. A method in accordance with claim 1, wherein the at least two energy beams comprise at least two laser beams.

5. A method in accordance with claim 1, wherein the single crystal region is produced along one of a stepped shoulder, a groove, and a depression at or in the surface of the single crystal substrate.

6. A method in accordance with claim 1, wherein the substrate is pre-heated to a pre-heat temperature, in the temperature range from 800° C. to 1000° C., the pre-heat temperature being kept constant during the manufacture of the single crystal region.

7. A method in accordance with claim 6, wherein the pre-heating takes place inductively.

8. A method in accordance with claim 1, wherein at least one of the substrate and the coating material includes a metallic super alloy.

9. A method in accordance with claim 8 wherein the metallic super alloy is on one of a cobalt base, an iron base and a nickel base.

10. A method in accordance with claim 8 wherein the super alloy comprises at least one of IN 738LC, IN 939, IN 100, B 1914, CM 99, SRR 99, CM-247 LC, CMSX-2, CMSX-3, CMSX-4, CMSX-6, Mar-M002 or other super alloys.

11. A method in accordance with claim 1, wherein the produced single crystal region is annealed at low stress after the single crystal welding at a temperature in the range from 1000° C. to 1250° C., preferably at approximately 1150° C.

12. A method in accordance with claim 11 wherein the temperature is approximately 1150° C.

13. A method in accordance with claim 1 including supplementing a single crystal surface structure of a worn single crystal turbine blade such as the rotor blade of a gas turbine or of an airplane engine.

14. A method in accordance with claim 1 wherein the at least two energy beams comprise electron beams.

15. A method according to claim 1 wherein the at least two energy beams comprise arc process beams.

16. A method of single crystal welding for the production of a single crystal region on a surface of a monocrystalline substrate by means of an energy beam, including:

the supply of a coating material;

the formation of a melt by melting the coating material by means of the energy beam;

and the melting of a surface layer of the single crystal substrate by the energy beam;

setting the energy distribution in the energy beam such that a lateral thermal flow from the melt into the single crystal substrate is minimized, and producing the single crystal region along one of a stepped shoulder, a groove, and a depression at or in the surface of the single crystal substrate.

17. A method of single crystal welding for the production of a single crystal region on a surface of a monocrystalline substrate by means of an energy beam, including:

the supply of a coating material;

the formation of a melt by melting the coating material by means of the energy beam;

and the melting of a surface layer of the single crystal substrate by the energy beam;

setting the energy distribution in the energy beam such that a lateral thermal flow from the melt into the single crystal substrate is minimized, and annealing the produced single crystal region at low stress after the single crystal welding at a temperature range from 1000° C. to 1250° C.

* * * * *